United States Patent [19]
Buer et al.

[11] Patent Number: 5,831,476
[45] Date of Patent: Nov. 3, 1998

[54] VOLTAGE-TUNED MILLIMETER-WAVE AMPLIFIER AND METHOD FOR TUNING

[75] Inventors: Kenneth Vern Buer, Gilbert; John Holmes, Scottsdale; David Warren Corman, Gilbert, all of Ariz.

[73] Assignee: Motorola, Inc., Schaumburg, Ill.

[21] Appl. No.: 753,817

[22] Filed: Dec. 2, 1996

[51] Int. Cl.$^6$ .................................................. H03F 3/193
[52] U.S. Cl. ................................ 330/2; 330/68; 330/277; 330/286; 330/296; 330/297
[58] Field of Search .................................. 330/2, 68, 277, 330/286, 256, 297

[56] References Cited

U.S. PATENT DOCUMENTS

| | | | |
|---|---|---|---|
| 4,924,191 | 5/1990 | Erb et al. | 330/296 X |
| 5,412,235 | 5/1995 | Nakajima et al. | 330/277 X |
| 5,412,340 | 5/1995 | Tanikoshi | 330/68 |

Primary Examiner—James B. Mullins
Attorney, Agent, or Firm—Gregory J. Gorrie

[57] ABSTRACT

A method (140) for tuning millimeter-wave FET amplifiers (20) during manufacture, through the application (144) of a gate bias voltage (52) so as to tune the FET (22) of the amplifier (20) to match an input circuit (24), and through the application (146) of a drain bias voltage (74) so as to tune the FET (22) of the amplifier (20) to match an output circuit (26), then measuring (150) the frequency response of the amplifier (20). This tuning method (140) is repeated (152) until a predetermined frequency response has been achieved. Once achieved, the predetermined frequency response is realized (154) by permanently fixing the gate bias voltage (52) and the drain bias voltage (74) at the determined values. This iterative method (140) of tuning amplifiers (20) is then repeated for all amplifiers (20) to be tuned.

15 Claims, 5 Drawing Sheets

VOLTAGE-TUNED MILLIMETER-WAVE AMPLIFIER AND METHOD FOR TUNING

FIELD OF THE INVENTION

The present invention pertains to the tuning of millimeter-wave amplifiers. More specifically, the present invention pertains to tuning FET millimeter-wave amplifiers during their manufacture.

BACKGROUND OF THE INVENTION

In a high-frequency microwave or millimeter-wave FET (field-effect transistor) amplifier internal parasitic capacitances become significant. At a frequency of 1 GHz a typical variation in gate-source capacitance ($C_{GS}$) of 700–1300 fF (femtofarads, i.e. $10^{-15}$ farads) is insignificant. At a frequency of 60 GHz, however, that same variation in capacitance can cause a frequency response variation of several gigahertz, severely impacting gain, bandwidth, noise figure, and return loss.

Traditionally, millimeter-wave amplifiers are matched to the frequencies and impedances required of the intended circuit. This match may be carried out in any of several ways.

A series of amplifiers may be matched to their intended circuits through screening. In this method, only those amplifiers whose parasitic capacitances fall into a narrow range around which the circuit has been designed are selected, all others being rejected. This screening process is exacting and time consuming, making it inefficient and costly. The rejected amplifiers are often discarded, further increasing the cost.

Similarly, a series of amplifiers may be matched to their intended circuits by tuning each circuit to each amplifier's characteristics. In this process, capacitances external to the amplifier are used to compensate for the internal capacitances of the amplifier. This requires the addition of extra components to the circuit and careful tuning of those components, decreasing efficiency and increasing cost. These extra components, often varactors, may themselves have a significant cost, exacerbating the problem.

Likewise, a series of amplifiers may be matched to the intended circuit by tuning each amplifier through manual mechanical adjustment of its internal capacitances. Thus, millimeter-wave amplifiers are traditionally designed with input and output impedance-matching stub capacitors. By physically trimming these stub capacitors, an amplifier's frequency response can be tuned to that of the desired circuit. The disadvantages of this approach are that access must be gained to the amplifier for the trimming to occur, thus a covering shield of the amplifier must be removable or perforated in some manner. This access often must be done in controlled clean-room conditions to avoid contamination, thus decreasing efficiency and increasing cost. A further increase in cost is incurred at the personnel level, as the individual(s) engaged in the trimming process need be highly skilled specialists. A third cost-increase factor is encountered should a trimming error occur, sending the amplifier in question to the scrap heap.

All of the methods described are low-efficiency, high-cost scenarios. What is needed is a method of matching millimeter-wave FET amplifiers to their desired circuits that tolerates a wide range of internal parasitic capacitances, requires only personnel of ordinary skill, and lends itself readily to volume production. In other words, what is needed is a method that is both efficient and low cost. The present invention fulfills that need.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWINGS

Figure 1:
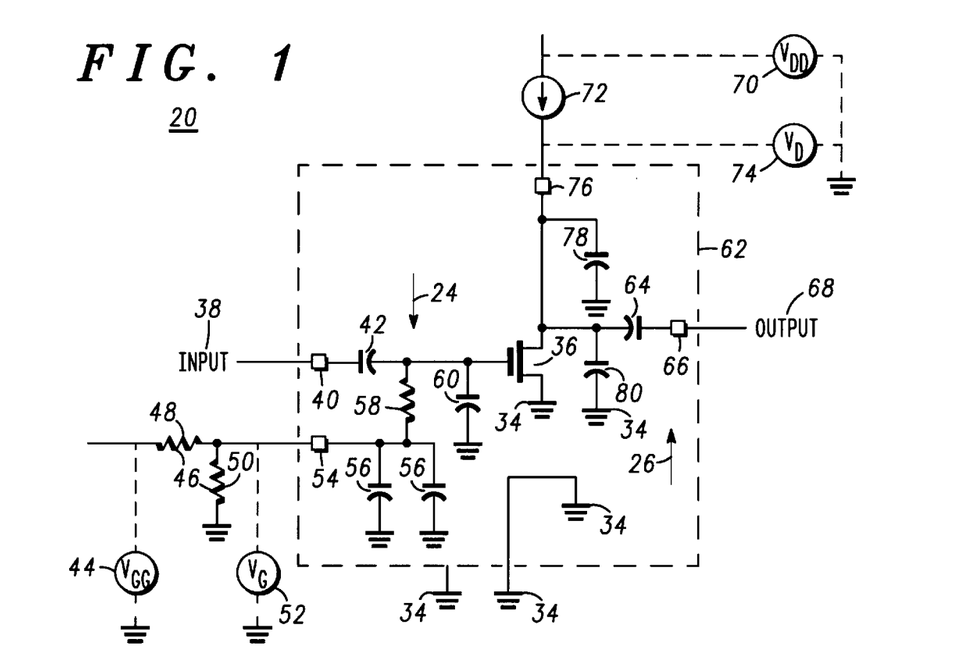
FIG. 1 depicts a schematic diagram of an exemplary millimeter-wave FET amplifier as used in a preferred embodiment of the present invention.
Figure 2:
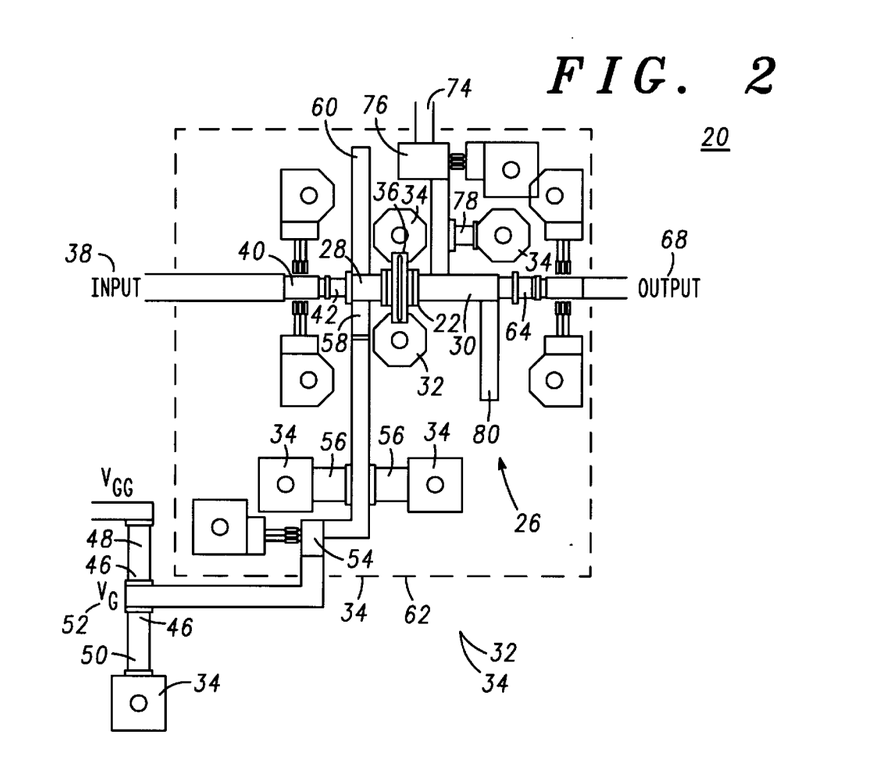
FIG. 2 depicts a plan view of an exemplary millimeter-wave FET amplifier as used in a preferred embodiment of the present invention.

FIG. 1 depicts a schematic diagram of an exemplary millimeter-wave FET amplifier 20 as used in a preferred embodiment of the present invention. FIG. 2 depicts a plan view of exemplary millimeter-wave FET amplifier 20. The same amplifier 20 is depicted in FIGS. 1 and 2, with FIG. 1 depicting amplifier 20 and its components schematically and with FIG. 2 depicting them physically.

Referring to FIGS. 1 and 2, amplifier 20 includes a circuit containing a monolithic GaAs FET (gallium-arsenide field-effect transistor) 22. FET 22 is the central component of amplifier 20.

Amplifier 20 can be divided into an input circuit 24 and an output circuit 26. Input circuit 24 includes all components "before" FET 22, i.e., involved with a gate 28 of FET 22, however peripherally. Likewise, output circuit 26 includes all components "after" FET 22, i.e., involved with a drain 30 of FET 22, however peripherally. All voltages discussed herein are given relative to the potential of a common substrate 32 (FIG. 2 only), hereinafter referred to as ground 34. A source 36 of FET 22 connects to ground 34.

In input circuit 24, an input signal 38 enters amplifier 20 through an input terminal 40 and passes through an input capacitor 42 to gate 28 of FET 22.

A gate supply voltage ($V_{GG}$) 44 is fed to a voltage divider 46 containing two serially-connected resistors. A first resistor 48 receives gate supply voltage 44 and is connected to a second resistor 50, which is in turn connected to ground 34. Voltage divider 46 produces a gate bias voltage ($V_G$) 52 at the junction of resistors 48 and 50. Gate bias voltage 52 is supplied to amplifier 20 through a gate bias terminal 54.

From gate bias terminal 54, gate bias voltage 52 is filtered by input decoupling capacitors 56 and an input decoupling resistor 58 and fed to gate 28 of FET 22. No significant dc current flows through gate 28. Hence no significant dc current flows through input decoupling resistor 58, no significant voltage drop develops across resistor 58, and the voltage at gate 28 is substantially identical to gate bias voltage 52 at gate bias terminal 54.

Input circuit 24 also includes an impedance-matching input stub capacitor 60 coupled to gate 28 of FET 22. In accordance with the preferred embodiment of the present invention, amplifier 20 need not be tuned by trimming stub capacitor 60.

The exemplary amplifier shown in FIGS. 1 and 2 is a self-contained unit completely encased in a shield 62 affixed to a substrate 32 (FIG. 2 only) and electrically connected to ground 34. Shield 62 serves to isolate amplifier 20 from noise and contaminants, and to stabilize the electrical properties of amplifier 20 by encasing it in a surrounding ground potential.

The preferred embodiment of the present invention eliminates the need to breach shield 62 to tune amplifier 20, thus preserving the integrity of amplifier 20. Such tuning occurs, at least in part, through the selection of gate bias voltage 52. For this reason, at least one of the resistors of voltage divider 46 should be located external to shield 62. In the exemplary amplifier 20 depicted in FIGS. 1 and 2, both first divider resistor 48 and second divider resistor 50 are shown so located.

Components other than those involved with amplifier 20, and amplifier 20 itself, may also be affixed to substrate 32 (FIG. 2 only). Those skilled in the art may readily devise other ways of configuring amplifier 20 and its related components.

Similarly, in output circuit 26, a signal leaving drain 30 of FET 22 passes through an output capacitor 64 to an output terminal 66, where it leaves amplifier 20 as an output signal 68. A drain supply voltage ($V_{DD}$) 70 is converted by a power source 72 into a drain bias voltage ($V_D$) 74. Drain bias voltage 74 is then fed through a drain bias terminal 76, where it is filtered by an output decoupling capacitor 78 and fed to drain 30 of FET 22. Power source 72 may be as simple as a single resistor, or as sophisticated as an entire control circuit.

Output circuit 26 also includes an impedance-matching output stub capacitor 80 coupled to drain 30 of FET 22. As in input circuit 24, amplifier 20 need not be tuned by trimming stub capacitor 80.

Figure 3:
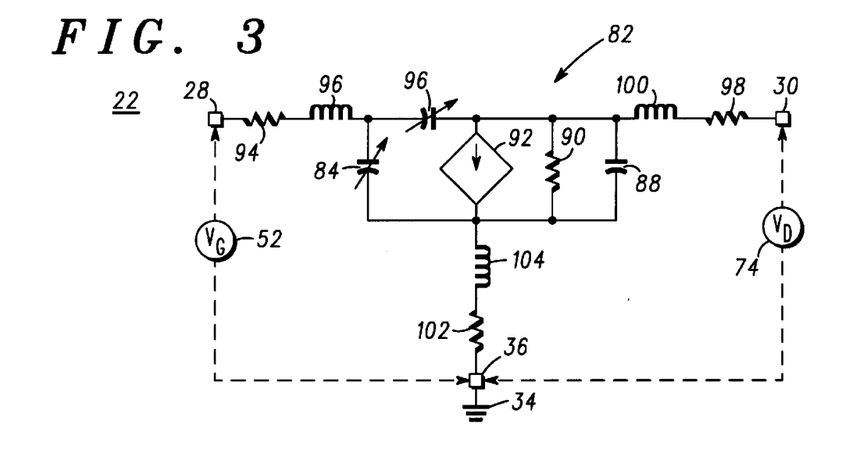
FIG. 3 depicts a schematic diagram of a standard lumped-element equivalent circuit of a FET as used in an amplifier in a preferred embodiment of the present invention.

FIG. 3 depicts a schematic diagram of a standard lumped-element equivalent circuit 82 of FET 22 as used in amplifier 20 (FIG. 1) in a preferred embodiment of the present invention.

As gate 28 is negatively biased via gate bias voltage 52, it is non-conducting, and is effectively capacitively coupled to a source 36 and drain 30 of FET 22. This capacitive coupling is shown as a pair of voltage-variable capacitances: gate-source capacitance ($C_{GS}$) 84 and gate-drain capacitance ($C_{GD}$) 86. These capacitances are variable as a result of the processes used in the manufacture of FET 22 itself, and are somewhat unpredictable from FET to FET. They are, however, predictable as to a minimum and a maximum value, and typically fall in the range of 700–1300 fF (femtofarads, $10^{-15}$ farads) for gate-source capacitance 84 and 10–1000 fF for gate-drain capacitance 86. In addition, $C_{GD}$ is variable dependent on the gate-drain voltage potential and $C_{GS}$ is variable dependent on the gate-source voltage potential.

Also present is a drain-source capacitance ($C_{DS}$) 88. This capacitance is relatively small and represents the "inherent" output capacitance of FET 22. A drain-source resistance ($R_{DS}$) 90 represents the inherent output resistance of FET 22. The value of resistance 90 together with a transconductance ($G_M$) 92, determines a voltage gain of FET 22. This is expressed as:

$$G_V = G_M \times R_{DS}; \qquad (1)$$

where:

$G_V$ is voltage gain;

$G_M$ is tranconductance 92; and $R_{DS}$ is drain-source resistance 90.

In addition, each terminal of FET 22 has an internal terminal resistance and inductance. For gate 28 these are resistance ($R_G$) 94 and inductance ($L_G$) 96; for drain 30 these are resistance ($R_D$) 98 and inductance ($L_D$) 100; and for source 36 these are resistance ($R_S$) 102 and inductance ($L_S$) 104. Each resistance and inductance represents the internal trace resistance and inductance for that terminal. All are relatively small values and all may be ignored for this discussion. In fact, were source terminal resistance 102 and inductance 104 not negligible, FET 22 would be incapable of sufficient voltage gain ($V_G$) to function in a millimeter-wave amplifier 20.

Figure 4:
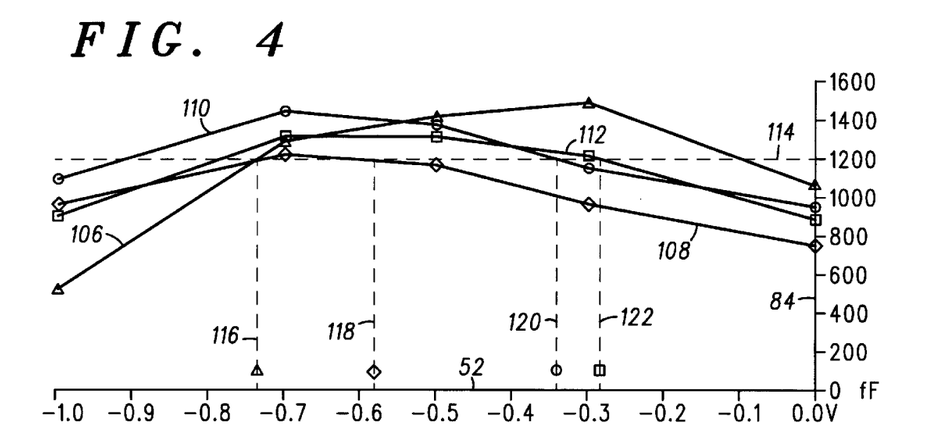
FIG. 4 depicts a plurality of exemplary gate-source capacitance versus gate bias voltage curves of FETs used in amplifiers in preferred embodiments of the present invention.

FIG. 4 depicts a plurality of exemplary gate-source capacitance 84 (FIG. 3) versus gate bias voltage 52 (FIG. 1) curves of FETs 22 (FIG. 3) used in amplifiers 20 (FIG. 1) in preferred embodiments of the present invention. The curves of four different exemplary FETs 22 are shown. These are designated as a first (triangle) curve 106, a second (diamond) curve 108, a third (circle) curve 110, and a fourth (square) curve 112. As can be seen in FIG. 4, each of the four curves has a maximal gate-source capacitance 84 within a range of gate bias voltage 52 of –1.0 to 0.0 volts.

Assuming, for the sake of example, that the design of amplifier 20 (FIG. 1) is idealized at a gate-source capacitance value 114 of 1200 fF. Curve 106 indicates that the FET 22 (FIG. 3) it exemplifies is configured so that it attains gate-source-capacitance value 114 with a gate-bias-voltage value 116 of approximately –0.73 volts. Similarly, Curves 108, 110, and 112 show that their exemplary FETs 22 are configured so that they attain gate-source-capacitance value 114 with gate-bias-voltage values 118, 120, and 122.

Figure 5:
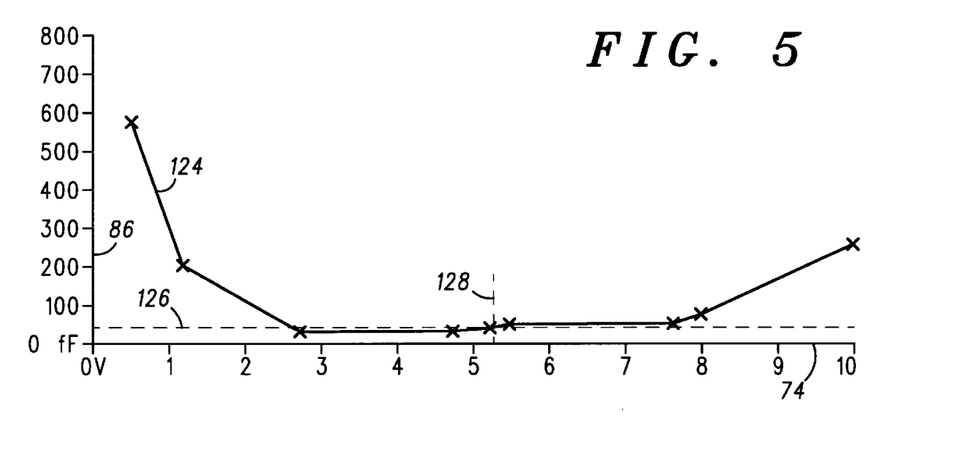
FIG. 5 depicts an exemplary gate-drain capacitance versus drain bias voltage curve of a FET used in an amplifier in a preferred embodiment of the present invention.

FIG. 5 depicts an exemplary gate-drain capacitance 86 (FIG. 3) versus gate-drain bias voltage 74 (FIG. 1) curve 124 of FET 22 (FIG. 3) used in amplifier 20 (FIG. 1) in a preferred embodiment of the present invention. Curve 124 has a variable gate-drain capacitance 86 within a range of drain bias voltage 74 of +0.5 to +10.0 volts.

Assuming that the design of amplifier 20 (FIG. 1) is idealized at a gate-drain-capacitance value 126 of 40 fF. Curve 124 indicates that the FET 22 (FIG. 3) it exemplifies is configured so that it attains gate-drain-capacitance value 126 with a gate-drain bias voltage value 128 of approximately 5.3 volts.

Figure 6:
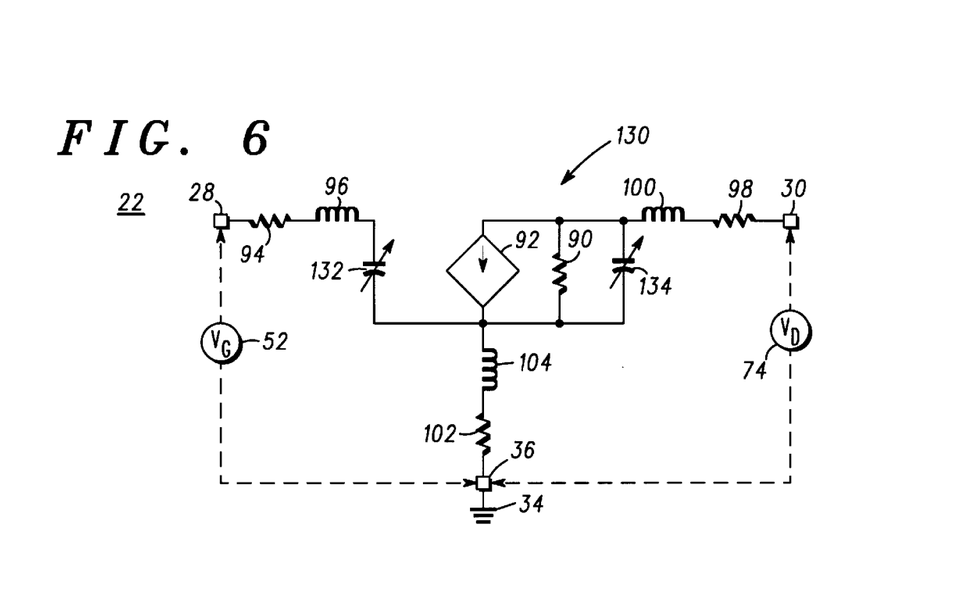
FIG. 6 depicts a schematic diagram of a typical Miller Identity reduction of a standard lumped-element equivalent circuit of a FET used in an amplifier in a preferred embodiment of the present invention.

FIG. 6 depicts a schematic diagram of a typical Miller Identity reduction 130 of standard lumped-element equivalent circuit 82 (FIG. 3) of FET 22 used in amplifier 20 (FIG. 1) in a preferred embodiment of the present invention. In this reduction 130, gate-source capacitance ($C_{GS}$) 84 (FIG. 3) has been replace by an effective input capacitance ($C_1$) 132, gate-drain capacitance ($C_{GD}$) 86 (FIG. 3) has been eliminated, and a drain-source capacitance ($C_{DS}$) 88 (FIG. 3) has been replaced by an effective output capacitance ($C_2$) 134.

As all components of FET 22 act together, altering one also alters another. Therefore, effective capacitances 132 and 134 are composites of physical capacitances 84, 86, and 88 (FIG. 3). Additionally, the resultant capacitances are affected by the voltage gain ($G_V$) of FET 22. The values of effective capacitances 132, and 134 are determined by the following equations:

$$C_1 = C_{GS} + C_{GD}(1-G_V); \quad (2)$$

$$C_2 = C_{GS} + C_{GD}(1-1/G_V); \quad (3)$$

where:

$G_V$ is the voltage gain of FET 22;

$C_1$ is effective input capacitance 132;

$C_2$ is effective output capacitance 134;

$C_{GS}$ is gate-source capacitance 84 (FIG. 3);

$C_{GD}$ is gate-drain capacitance 86 (FIG. 3); and $C_{DS}$ is drain-source capacitance 88 (FIG. 3).

Equations (2) and (3) indicate that even though gate-drain capacitance 86 is at least an order of magnitude smaller than gate-source capacitance 84, its effective output capacitance 134 is sufficient to tune the output of FET 22 (FIG. 3) at millimeter-wave frequencies.

Figure 7:
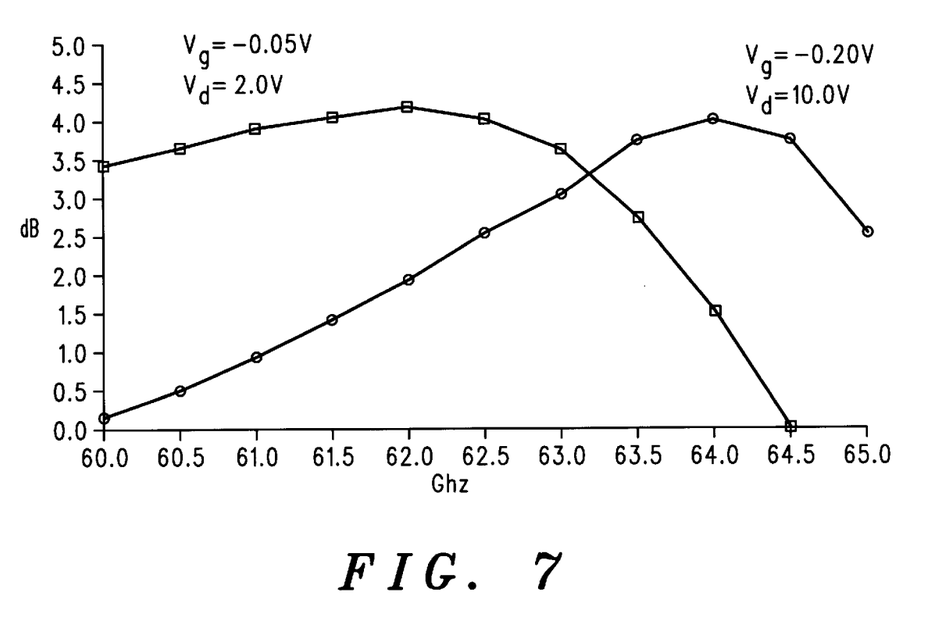
FIG. 7 depicts a pair of exemplary response curves for an amplifier operating at differing sets of bias voltages in a preferred embodiment of the present invention.

FIG. 7 depicts a pair of exemplary response curves for amplifier 20 (FIG. 1) operating at differing sets of bias voltages in a preferred embodiment of the present invention. Exemplary amplifier 20 (FIG. 1) produces a first frequency-response curve 136 with gate bias voltage 52 (FIG. 6) of −0.50 volts and drain bias voltage 74 (FIG. 6) of +2.0 volts. First response curve 136 indicates a center frequency of approximately 62 GHz. A shift in gate bias voltage 52 from −0.50 to −0.20 volts and drain bias voltage 74 from +2.0 to +10.0 volts produces a second frequency-response curve 138 with a center frequency of approximately 64 GHz. Thus, when operating in the high millimeter-wave region of the spectrum, the frequency response of amplifier 20 (FIG. 1) is tuned via gate bias voltage 52 and drain bias voltage 74.

Figure 8:
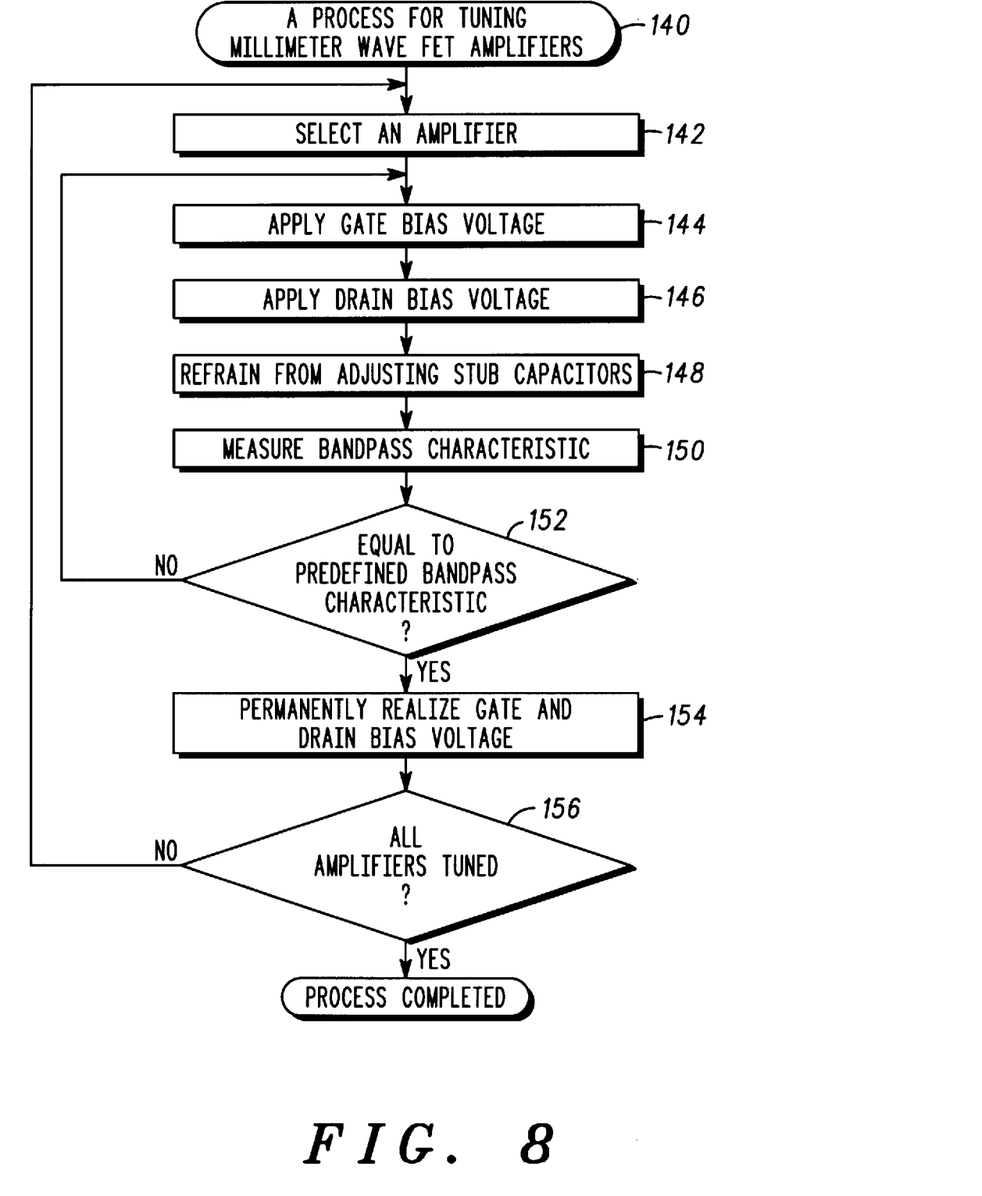
FIG. 8 depicts a flowchart of an exemplary process for tuning millimeter-wave FET amplifiers as used in a preferred embodiment of the present invention.

FIG. 8 depicts a flowchart of an exemplary process 140 for tuning millimeter-wave FET amplifiers 20 (FIG. 1) as used in a preferred embodiment of the present invention. The purpose of tuning amplifier 20 is to maximize gain and optimize impedance matching of amplifier 20 when used in a specific desired circuit.

The following discussion of process 140 refers to FIGS. 1, 2, and 8.

A task 142 is performed wherein the amplifier 20 to be tuned is selected from among a plurality of amplifiers 20. Selected amplifier 20 should be encased in a shield 62 and mounted to a substrate 32 with at least on resistor of voltage divider 46 mounted outside of shield 62.

A next task 144 applies a specific gate bias voltage ($V_G$) 52 to gate 28 FET 22. Gate bias voltage 52 may be applied through the use of an appropriate ratio of values for resistors 48 and 50 of voltage divider 46, or through the use of an external voltage source.

A following task 146 applies a specific drain bias voltage ($V_D$) 74 to FET 22 though the use of an appropriate power source 72.

The application of gate bias voltage 52 and, to a lesser degree, drain bias voltage 74 causes a change in the effective input capacitance 132 (FIG. 6) and the effective output capacitance 134 (FIG. 6). These capacitances are composites of gate-source capacitance 84 (FIG.3), gate-drain capacitance 86 (FIG.3), drain-source capacitance 88 (FIG.3), and the voltage gain of FET 22 as previously described in equations 1–3. The changes in effective capacitances 132 and 134 tune the frequency response of amplifier 20 as discussed above.

A task 148 then refrains from making any alterations to input impedance-matching stub capacitance 60 and output impedance-matching stub capacitance 80. By leaving stub capacitances 60 and 80 unadjusted, shield 62 need not be breached, thus preserving the integrity of amplifier 20, eliminating the need for special clean-room conditions, and obviating the necessity for highly-skilled personnel to make the alterations.

A task 150 subsequently measures the frequency response of amplifier 20. This frequency response corresponds to the set of bias voltages applied. That is, it is determined by the specific value of gate bias voltage 52 applied in task 144 and the specific value of drain bias voltage 74 applied in task 146. Frequency response is measured in a normal manner.

In task 152, the specific frequency response measured in task 150 is compared to a predetermined frequency response. Should this comparison determine that the specific frequency response of amplifier 20 does not substantially equal the predetermined frequency response, then another iteration of tasks 144, 146, 148, 150, and 152 is made, utilizing a different set of bias voltages. That is, a different specific gate bias voltage ($V_G$) 52 is applied to gate 28 of FET 22 in task 144 and/or a different specific drain bias voltage ($V_D$) 74 is applied to drain 30 of FET 22 in task 146.

These iterations of tasks 144, 146, 148, 150, and 152 are repeated until task 152 determines that the specific frequency response of amplifier 20 does substantially equal the predetermined frequency response.

Once the specific frequency response of amplifier 20 is substantially equal to the predetermined frequency response, a task 154 permanently realizes a first set of final bias voltages 52 and 74 that determine the specific frequency response. This is accomplished for input circuit 24 by using voltage divider 46 to provide a final gate bias voltage 52. That is, the values of resistors 48 and/or 50 of voltage divider 46 are fixed at those values that correspond to the specific frequency response that is substantially equal to the predetermined frequency response. Simultaneously, this is accomplished for output circuit 26 by using power source 72 to provide a final drain bias voltage 74. That is, the properties of power source 72 are fixed at those properties that correspond to the specific frequency response that is substantially equal to the predetermined frequency response.

A task 156 then determines if all desired amplifiers 20 (FIG. 1) have been tuned. If they have not, tasks 142, 144, 146, 148, 150, 152, 154, and 156 are repeated until they have. These repeated tasks produce a second and following sets of final bias voltages 52 and 74 that differ from the first set and from each other because different FETs 22 used in different amplifiers 20 have different characteristics. When task 156 determines that all amplifiers 20 have been tuned, process 140 is complete.

In summary, the current invention provides a millimeter-wave FET amplifier 20 (FIG. 1) capable of being tuned through the use of bias voltages, rather than the currently accepted methods of screening amplifiers to match an existing circuit, independently tuning each circuit to match existing amplifiers, or tuning each amplifier to match its circuit by trimming the amplifiers stub tuning capacitances. The present invention provides a low-waste, high-efficiency, medium-skill, production method of accomplishing the required tuning, thus reducing cost and increasing efficiency.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method for tuning millimeter-wave amplifiers during the manufacture thereof, said amplifiers comprising a field effect transistor (FET) having an input-impedance matching stub capacitor coupled to the FET's gate and having an output-impedance matching stub capacitor coupled to the FET's drain, said FET and said stub capacitors fabricated on a substrate and being encased in a grounding shield coupled to said substrate, said method comprising the steps of:

applying a gate bias voltage to said FET of one of said amplifiers; applying a drain bias voltage to said FET of one of said amplifiers;

measuring a frequency response of said one amplifier;

repeating said applying steps and said measuring step until substantially a predetermined frequency response has been achieved for said one amplifier;

refraining from altering said input impedance-matching stub capacitor and said output impedance-matching stub capacitor to achieve said predetermined frequency response; and including permanent circuitry in said one amplifier to provide final gate and drain bias voltages which achieve the predetermined frequency response, said permanent circuitry breaching said grounding shield.

2. A method as claimed in claim 1 further comprising the steps of:

applying a gate bias voltage to another of said amplifiers so as to tune an input circuit of said other amplifier;

applying a drain bias voltage to said other amplifier so as to tune an output circuit of said other amplifier;

measuring said frequency response of said other amplifier;

repeating said applying said gate and drain bias to said other amplifier steps step and said measuring said frequency response of said other amplifier step until substantially said predetermined frequency response has been achieved;

refraining from altering said input impedance-matching stub capacitor and said output impedance-matching stub capacitor of said other amplifier to achieve said predetermined frequency response; and including other permanent circuitry in said other amplifier to provide final gate and drain bias voltages which achieve the predetermined frequency response of said other amplifier, said other permanent circuitry breaching said grounding shield.

3. A method as claimed in claim 2 wherein:

a first final gate bias voltage is achieved for said one amplifier:

a second final gate bias voltage is achieved for said other amplifier; and said first final gate bias voltage differs from said second final gate bias voltage.

4. A method as claimed in claim 1 additionally comprising the step of configuring said one amplifier so that a variation in said gate bias voltage produces a variation in an effective input capacitance of said amplifier.

5. A method as claimed in claim 4 wherein said effective input capacitance is a composite of a gate-source capacitance and a gate-drain capacitance.

6. A method as claimed in claim 1 additionally comprising the step of configuring said one amplifier so that a variation in said drain bias voltage produces a variation in an effective output capacitance of said amplifier.

7. A method as claimed in claim 6 wherein said effective output capacitance is a composite of a gate-drain capacitance and a drain-source capacitance.

8. A method as claimed in claim 1 wherein said applying said gate voltage step comprises the step of using a resistive voltage divider to establish said gate bias voltage.

9. A method as claimed in claim 8 additionally comprising the steps of:

encasing said amplifier in said shield prior to performing the applying steps; and locating a resistor of said resistive voltage divider external to said shield.

10. A method for tuning millimeter-wave FET amplifiers during the manufacture thereof, each of said amplifiers comprising a field effect transistor (FET) having an associated input-impedance matching stub capacitor coupled to the FET's gate, each FET having an associated output-impedance matching stub capacitor coupled to each FET's drain, each FET and said associated stub capacitors fabricated on a substrate and being encased in a grounded shield coupled to said substrate, said method comprising the steps of:

a) applying gate bias voltages to the FET of each of said amplifiers so as to tune input circuits of said amplifiers;

b) applying drain bias voltages to the FET of each of said amplifiers so as to tune output circuits of said amplifiers;

c) measuring frequency responses of said amplifiers;

d) repeating said applying step a), said applying step b), and said measuring step c) for each of said amplifiers until substantially a predetermined frequency response has been achieved, wherein said repeating step d) achieves sets of final gate bias voltages and final drain bias voltages for each of said amplifiers which correspond to said predetermined frequency response, and said sets of final gate bias voltages and said final drain bias voltages for each of said amplifiers differ from each other;

refraining from altering said input impedance-matching stub capacitor and said output impedance-matching stub capacitor of each of said amplifiers during to achieve said predetermined frequency response; and including permanent circuitry in each amplifier to provide said final gate and drain bias voltages for each amplifier, said permanent circuitry breaching said grounding shield.

11. A method as claimed in claim 10 additionally comprising the steps of:

configuring each of said amplifiers so that variations in said gate bias voltages produce variations in effective input capacitance's of said amplifiers; and configuring each of said amplifiers so that variations in said drain bias voltages produce variations in effective output capacitance's of said amplifiers.

12. A method as claimed in claim 11 wherein:

said effective input capacitances are composites of gate-source capacitances and gate-drain capacitances; and said effective output capacitances are composites of gate-drain capacitances and drain-source capacitances.

13. A method as claimed in claim 10 wherein said applying step a) comprises the step of using resistive voltage dividers to establish said gate bias voltages, and said method additionally comprises the steps of:

encasing said amplifiers in said shields prior to performing steps a) and b); and locating a resistor of each of said resistive voltage dividers external to said shields.

14. A tuned millimeter-wave FET amplifier comprising:
a field-effect transistor (FET) having a gate terminal, a drain terminal, and a source terminal;
an input circuit coupled to said FET gate terminal, said input circuit having an unadjusted input impedance-matching stub capacitor;
an output circuit coupled to said FET drain terminal, said output circuit having an unadjusted output impedance-matching stub capacitor;
a grounding shield encasing said FET, said input circuit and said output circuit;
a gate bias voltage source coupled to said input circuit, said gate bias voltage source exhibiting a voltage which has been tuned to cause said amplifier to achieve substantially a predetermined frequency response; and
a drain bias voltage source coupled to said output circuit, said drain bias voltage source exhibiting a voltage which has been tuned to cause said amplifier to achieve substantially said predetermined frequency response,
said gate and drain bias voltage sources including permanent circuitry to provide final gate and drain bias voltages which achieve the predetermined frequency response, said permanent circuitry breaching said grounding shield.

15. A tuned millimeter-wave FET amplifier as claimed in claim 14 wherein said tuned millimeter-wave FET amplifier is one of a plurality of tuned millimeter-wave FET amplifier; each tuned millimeter-wave FET amplifier of said plurality comprising:

a field-effect transistor (FET) having a gate terminal, a drain terminal, and a source terminal;
an input circuit coupled to said FET gate terminal, said input circuit having an unadjusted input impedance-matching stub capacitor;
an output circuit coupled to said FET drain terminal, said output circuit having an unadjusted output impedance-matching stub capacitor;
a grounding shield encasing said FET, said input circuit and said output circuit;
a gate bias voltage source coupled to said input circuit, said gate bias voltage source exhibiting a voltage which has been tuned to cause said amplifier to achieve substantially a predetermined frequency response; and
a drain bias voltage source coupled to said output circuit, said drain bias voltage source exhibiting a voltage which has been tuned to cause said amplifier to achieve substantially said predetermined frequency response,
said gate and drain bias voltage sources including permanent circuitry to provide final gate and drain bias voltages which achieve the predetermined frequency response, said final gate and drain bias voltages varying among said amplifiers of said plurality and having varying permanent circuitry for different amplifiers of said plurality.

* * * * *